United States Patent
Feng et al.

(10) Patent No.: US 9,867,135 B1
(45) Date of Patent: Jan. 9, 2018

(54) FREQUENCY-GENERATING CIRCUIT AND COMMUNICATIONS APPARATUS

(71) Applicant: MEDIATEK INC., Hsin-Chu (TW)

(72) Inventors: Shao-Wei Feng, Taipei (TW); Shih-Chi Shen, New Taipei (TW); Tso-Mo Chen, Taipei (TW); Chun-Ming Kuo, Hsinchu (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 15/425,183

(22) Filed: Feb. 6, 2017

(51) Int. Cl.
| | |
|---|---|
| H03L 7/26 | (2006.01) |
| H04W 52/02 | (2009.01) |
| H03L 7/16 | (2006.01) |
| H03B 5/32 | (2006.01) |

(52) U.S. Cl.
CPC ............ H04W 52/029 (2013.01); H03B 5/32 (2013.01); H03L 7/16 (2013.01)

(58) Field of Classification Search
CPC ........... H04W 52/029; H04W 52/0216; H04W 52/0229; H04W 52/0293; H03B 5/32; H03B 5/366; H04B 1/28; H04B 1/109; H04B 1/525; H03M 1/08; H03L 7/16; H03L 1/1794; H03L 7/07; H03L 7/0805; H03L 7/0814
See application file for complete search history.

(56) References Cited

U.S. PATENT DOCUMENTS

| | | | |
|---|---|---|---|
| 8,248,106 B1 * | 8/2012 | Cohen ..................... | H03L 7/081 |
| | | | 327/156 |
| 9,287,886 B2 | 3/2016 | Ciccarelli et al. | |
| 2009/0154615 A1 * | 6/2009 | Hijikata ................... | H04B 1/28 |
| | | | 375/344 |
| 2009/0296531 A1 * | 12/2009 | Haartsen ............. | H04W 52/029 |
| | | | 368/47 |
| 2015/0097627 A1 * | 4/2015 | Jiang ........................ | H03L 7/06 |
| | | | 331/18 |
| 2017/0097613 A1 * | 4/2017 | Tertinek .................. | H03M 1/08 |

OTHER PUBLICATIONS

Staszewski, R.B.; "State-of-the-Art and Future Directions of High-Performance All-Digital Frequency Synthesis in Nanometer CMOS;" IEEE; 2010; pp. 229-232.

* cited by examiner

Primary Examiner — Thanh Le
(74) Attorney, Agent, or Firm — McClure, Qualey & Rodack, LLP

(57) ABSTRACT

A frequency-generating circuit includes a frequency synthesizer circuit and a reference clock signal processor. The frequency synthesizer circuit receives a processed reference clock signal and generates a radio-frequency clock signal according to the processed reference clock signal. The reference clock signal processor receives an original reference clock signal from an oscillator and processes the original reference clock signal according to an indication signal to generate the processed reference clock signal. The indication signal is generated according to a required reference clock frequency of a communications apparatus. When the required reference clock frequency is high, a frequency of the processed reference clock signal is a multiple of a frequency of the original reference clock signal, and when the required reference clock frequency is low, the frequency of the original reference clock signal is a multiple of the frequency of the processed reference clock signal.

16 Claims, 6 Drawing Sheets

FREQUENCY-GENERATING CIRCUIT AND COMMUNICATIONS APPARATUS

BACKGROUND OF THE INVENTION

Field of the Invention

The invention relates to a frequency-generating circuit and controlling methods thereof.

Description of the Related Art

With the emergence of technologies behind cellular networks, embedded systems, and the Internet, mobile communications devices (apparatuses) such as smartphones and tablets have become popular because they combine the mobility of a cellular phone with the functionality of a computer or personal digital assistant (PDA) into a single device.

Because the power supply in mobile communications devices is often limited to batteries, how to reduce power consumption and extend the standby and operation time of the mobile communications devices are issues worthy of concern.

Therefore, a novel frequency-generating circuit structure and the controlling methods thereof are proposed.

BRIEF SUMMARY OF THE INVENTION

A frequency-generating circuit and a communications apparatus are provided. An exemplary embodiment of a frequency-generating circuit comprises a frequency synthesizer circuit and a reference clock signal processor. The frequency synthesizer circuit receives a processed reference clock signal and generates a radio-frequency clock signal according to the processed reference clock signal. The reference clock signal processor receives an original reference clock signal from an oscillator and processes the original reference clock signal according to an indication signal to generate the processed reference clock signal. The indication signal is generated according to a required reference clock frequency of a communications apparatus. When the required reference clock frequency is high, a frequency of the processed reference clock signal is a multiple of a frequency of the original reference clock signal, and when the required reference clock frequency is low, the frequency of the original reference clock signal is a multiple of the frequency of the processed reference clock signal. The frequency of the processed reference clock signal is dynamically adjusted during existence of a radio link established between a network device and the communications apparatus An exemplary embodiment of a communications apparatus comprises a frequency-generating circuit and a reference clock controller. The frequency-generating circuit generates a radio-frequency clock signal according to an original reference clock signal. The reference clock controller generates an indication signal according to a required reference clock frequency. The frequency-generating circuit comprises a frequency synthesizer circuit and a reference clock signal processor. The frequency synthesizer circuit receives a processed reference clock signal and generates the radio-frequency clock signal according to the processed reference clock signal. The reference clock signal processor receives the original reference clock signal from an oscillator and processes the original reference clock signal according to an indication signal to generate the processed reference clock signal. When the required reference clock frequency is high, a frequency of the processed reference clock signal is a multiple of a frequency of the original reference clock signal, and when the required reference clock frequency is low, the frequency of the original reference clock signal is a multiple of the frequency of the processed reference clock signal.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
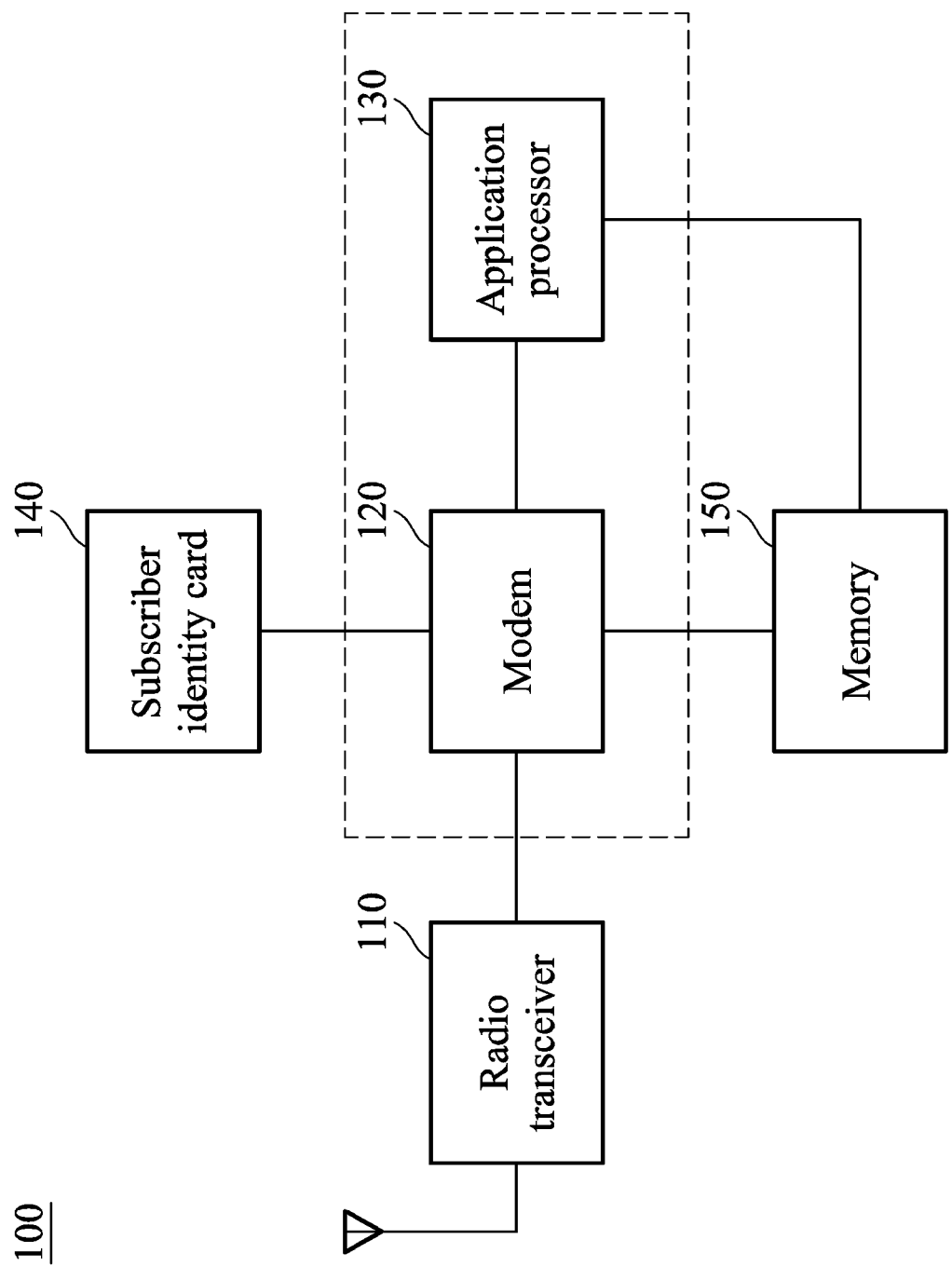
FIG. 1 shows an exemplary block diagram of a communications apparatus according to an embodiment of the invention.

FIG. 1 shows an exemplary block diagram of a communications apparatus according to an embodiment of the invention. The communications apparatus 100 may be a portable electronic device, such as a Mobile Station (MS, which may be interchangeably referred to as User Equipment (UE)). The communications apparatus 100 may comprise at least an antenna module comprising at least one antenna, a radio transceiver 110, a modem 120, an application processor 130, a subscriber identity card 140 and a memory 150. The radio transceiver 110 may receive wireless radio frequency signals via the antenna module, transmit wireless radio frequency signals via the antenna module, and perform RF signal processing. For example, the radio transceiver 110 may convert the received signals to intermediate frequency (IF) or baseband signals to be processed, or receive the IF or baseband signals from the modem 120 and convert the received signals to wireless radio frequency signals to be transmitted to a network device. According to an embodiment of the invention, the network device may be a cell, an evolved node B, a base station, a Mobility Management Entity (MME) etc., at the network side and may communicate with the communications apparatus 100 via the wireless radio frequency signals.

The radio transceiver 110 may comprise a plurality of hardware devices to perform radio frequency conversion and RF signal processing. For example, the radio transceiver 110 may be circuitry and may comprise a power amplifier circuit for amplifying the RF signals, a filter circuit for filtering unwanted portions of the RF signals, a frequency-generating circuit for generating a signal oscillating at a desired radio frequency and/or a mixer circuit for performing radio frequency conversion. According to an embodiment of the invention, the radio frequency may be, for example, 900 MHz or 1800 MHz for a Global System for Mobile communications (GSM), or 1900 MHz for a Universal Mobile Telecommunications System (UMTS), or the frequency of any specific frequency band for a Long-Term Evolution (LTE) system, etc.

The modem 120 may be a cellular communications modem configured for handling cellular system communications protocol operations and processing the IF or baseband signals received from, or to be transmitted to, the radio transceiver 110. The application processor 130 is configured for running the operating system of an application framework of the communications apparatus 100 and running application programs installed in the communications apparatus 100. In the embodiments of the invention, the modem 120 and the application processor 130 may be designed as discrete chips with some buses or hardware interfaces coupled therebetween, or they may be integrated into a combo chip (i.e., a system on chip (SoC)), and the invention should not be limited thereto.

The subscriber identity card 140 may be a SIM, USIM, R-UIM or CSIM card, or the like and may typically contain user account information, an International Mobile Subscriber Identity (IMSI) and a set of SIM application toolkit (SAT) commands, and it may provide storage space for phone book contacts. The memory 150 may be coupled to the modem 120 and application processor 130 and may store system data or user data.

Note that, in order to clarify the concept of the invention, FIG. 1 presents a simplified block diagram in which only the elements relevant to the invention are shown. For example, in some embodiments of the invention, the communications apparatus may further comprise some peripheral devices not shown in FIG. 1. In another example, in some embodiments of the invention, the communications apparatus may further comprise a central controller coupled to the modem 120 and the application processor 130. Therefore, the invention should not be limited to what is shown in FIG. 1.

Note further that although FIG. 1 shows a single-card single-standby application, the invention should not be limited thereto. For example, in some embodiments of the invention, the communications apparatus may comprise multiple subscriber identity cards to support multiple radio access technologies (RATs) communications. In the multiple RATs communications applications, the modem, the radio transceiver and/or the antenna module may be shared by the subscriber identity cards and may have the capability of handling the operations of multiple cellular system communications protocols and processing the corresponding RF, IF or baseband signals in compliance with multiple cellular system communications protocols. Those who are skilled in this technology can still make various alterations and modifications based on the descriptions given above to derive the communications apparatuses comprising multiple radio transceivers and/or multiple antenna modules for supporting multiple RAT wireless communications without departing from the scope and spirit of this invention. Therefore, in some embodiments of the invention, the communications apparatus may be designed to support a multi-card multi-standby application by making some alterations and modifications.

Note further that the subscriber identity card 140 may be dedicated hardware cards as described above, or in some embodiments of the invention, there may be individual identifiers, numbers, addresses, or the like which are burned in the internal memory of the corresponding modem and are capable of identifying the communications apparatus. Therefore, the invention should not be limited to what is shown in the figures.

Figure 2:
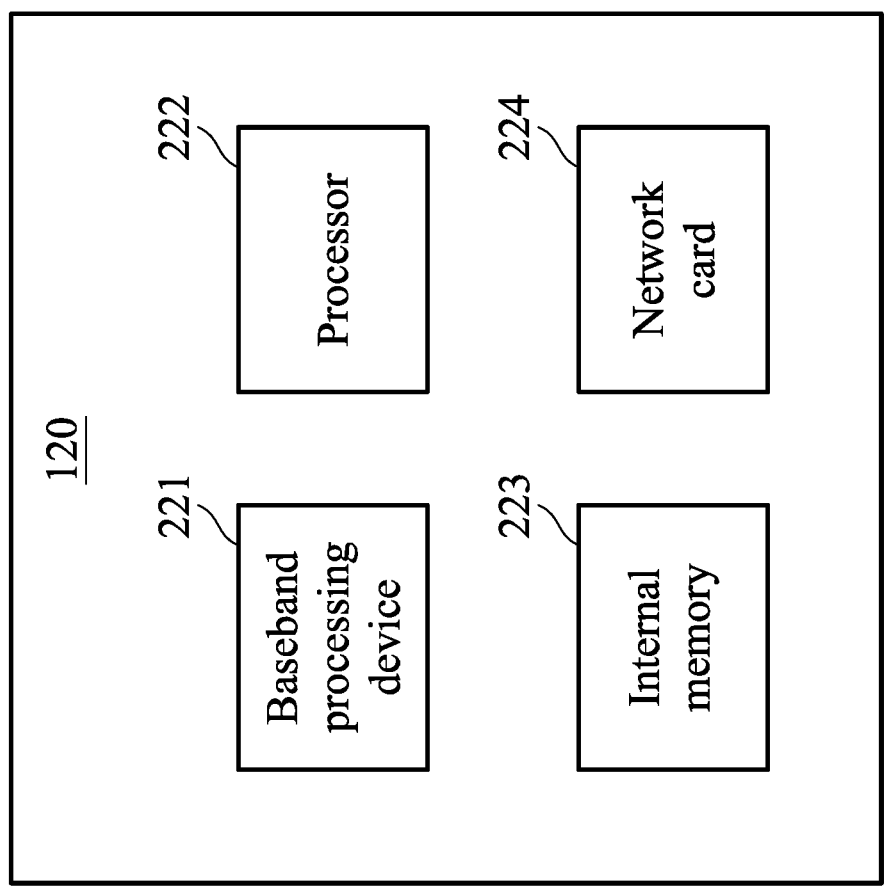
FIG. 2 shows an exemplary block diagram of a modem according to an embodiment of the invention.

FIG. 2 shows an exemplary block diagram of a modem according to an embodiment of the invention. The modem 120 may comprise at least a baseband processing device 221, a processor 222, an internal memory 223 and a network card 224. The baseband processing device 221 may receive the IF or baseband signals from the radio transceiver 110 and perform IF or baseband signal processing. For example, the baseband processing device 221 may convert the IF or baseband signals to a plurality of digital signals, and process the digital signals, and vice versa. The baseband processing device 221 may be circuitry and may comprise a plurality of circuits to perform signal processing, such as an analog-to-digital converter circuit for ADC conversion, a digital-to-analog converter circuit for DAC conversion, an amplifier circuit for gain adjustment, a modulator circuit for signal modulation, a demodulator circuit for signal demodulation, a encoder circuit for signal encoding, a decoder circuit for signal decoding, and so on.

The processor 222 may control the operations of the modem 120. According to an embodiment of the invention, the processor 222 may be configured to execute the program codes of the corresponding software module of the modem 120. The processor 222 may maintain and execute the individual tasks, threads, and/or protocol stacks for different software modules. In a preferred embodiment, a protocol stack may be implemented so as to respectively handle the radio activities of one RAT. However, it is also possible to implement more than one protocol stack to handle the radio activities of one RAT at the same time, or implement only one protocol stack to handle the radio activities of more than one RAT at the same time, and the invention should not be limited thereto.

The processor 222 may also read data from the subscriber identity card coupled to the modem, such as the subscriber identity card 140, and write data to the subscriber identity card. The internal memory 223 may store system data and user data for the modem 120. The processor 222 may also access the internal memory 223.

The network card 224 provides Internet access services for the communications apparatus. Note that although the network card 224 shown in FIG. 2 is configured inside of the modem, the invention should not be limited thereto. In some embodiments of the invention, the communications apparatus may also comprise a network card configured outside of the modem, or the communications apparatus may also be coupled to an external network card for providing Internet access services. Therefore, the invention should not be limited to any specific implementation method.

Note further that, in order to clarify the concept of the invention, FIG. 2 presents simplified block diagrams in which only the elements relevant to the invention are shown. Therefore, the invention should not be limited to what is shown in FIG. 2.

Note further that in some embodiments of the invention, the modem may comprise more than one processor and/or more than one baseband processing device. For example, the modem may comprise multiple processors and/or multiple baseband processing devices for supporting multi-RAT operations. Therefore, the invention should not be limited to what is shown in FIG. 2.

Figure 3:
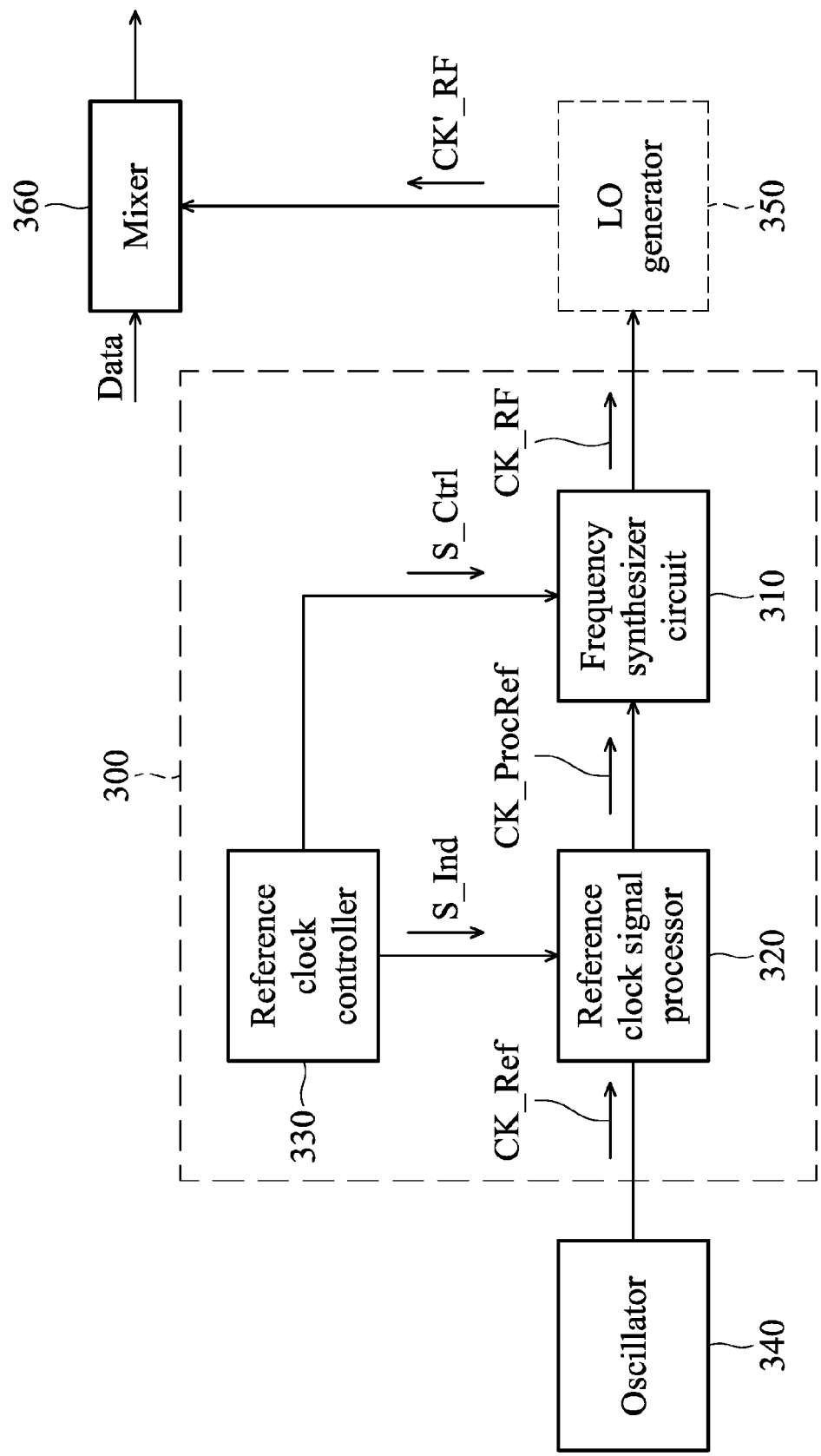
FIG. 3 shows an exemplary block diagram of a frequency-generating circuit according to an embodiment of the invention.

FIG. 3 shows an exemplary block diagram of a frequency-generating circuit according to an embodiment of the invention. The frequency-generating circuit 300 generates a radio-frequency clock signal CK_RF according to an original reference clock signal CK_Ref. According to an embodiment of the invention, the frequency-generating circuit 300 may at least comprise a frequency synthesizer circuit 310 and a reference clock signal processor 320.

The reference clock signal processor 320 receives the original reference clock signal CK_Ref from an oscillator 340 and processes the original reference clock signal CK_Ref according to an indication signal S_Ind to generate a processed reference clock signal CK_ProcRef.

The frequency synthesizer circuit 310 receives the processed reference clock signal CK_ProcRef and is ticked by the processed reference clock signal CK_ProcRef, so as to generate the radio-frequency clock signal CK_RF according to the processed reference clock signal CK_ProcRef. According to an embodiment of the invention, the frequency synthesizer circuit 310 may be an all-digital phase locked loop (ADPLL), such as a multi modulus divider (MMD)-less ADPLL or an MMD ADPPL, an analog PLL, or any other type of PLL.

The radio-frequency clock signal CK_RF may be provided to a local oscillating signal generator (LO generator) 350. The LO generator 350 may further process the radio-frequency clock signal CK_RF (for example, diving the frequency of the radio-frequency clock signal CK_RF) and generate a processed radio-frequency clock signal CK'_RF. The mixer 360 may receive the processed radio-frequency clock signal CK'_RF and multiply the processed radio-frequency clock signal CK'_RF with the data signal Data, so as to carry the data signal Data onto the carrier frequency. Note that in some other embodiments, the mixer 360 may also directly receive the unprocessed radio-frequency clock signal CK_RF and multiply the radio-frequency clock signal CK_RF with the data signal Data, and the invention should not be limited thereto.

According to an embodiment of the invention, the frequency-generating circuit 300 may further comprise a reference clock controller 330. The reference clock controller 330 generates the indication signal S_Ind and a control signal S_Ctrl according to a required reference clock frequency. The reference clock signal processor 320 may determine the frequency of the processed reference clock signal CK_ProcRef according to the indication signal S_Ind. Since the frequency of the processed reference clock signal CK_ProcRef may be dynamically adjusted, the frequency synthesizer circuit 310 may also accordingly control or adjust the parameters utilized for generating the radio-frequency clock signal CK_RF according to the control signal S_Ctrl (or, according to the required reference clock frequency). The parameters may be, for example, the divisor of a frequency divider comprised in the frequency synthesizer circuit 310, the bandwidth of a filter comprised in the frequency synthesizer circuit 310, or others. In an embodiment of the invention, the divisor refers to a ratio of the frequency of the radio-frequency clock signal and the frequency of the processed reference clock signal.

Note that in the embodiments of the invention, the reference clock controller 330 may be implemented by either a dedicated hardware circuit or a software module. When the reference clock controller 330 is implemented by a software module, the processor 222 of the modem 120 may execute the program codes of the software module to implement the corresponding functions.

The oscillator 340 may be a crystal oscillator and configured to generate the original reference clock signal CK_Ref as a fundamental clock signal with an accurate frequency. The original reference clock signal CK_Ref may be provided not only to the frequency-generating circuit 300, but also provided to any other circuit component in the communications apparatus 100 that needs a fundamental clock signal. Generally, one oscillator is utilized to generate one fundamental clock signal with a predetermined frequency. When multiple fundamental clock signals with different frequencies are required, multiple oscillators should be introduced.

However, as the number of oscillators is increased, the circuit area is increased and the hardware cost is increased as well. In order to reduce power consumption of the communications apparatus 100 without further increasing the number of oscillators, a novel frequency-generating circuit structure and the controlling methods thereof are proposed.

According to the embodiments of the invention, the frequency of the reference clock signal can be dynamically adjusted by the reference clock signal processor 320 according to different reference clock frequency requirements of the communications apparatus 100, so as to reduce power consumption of the communications apparatus 100.

For the frequency synthesizer circuit 310 taking the processed reference clock signal CK_ProcRef as a reference to generate the radio-frequency clock signal CK_RF, when the frequency of the processed reference clock signal CK_ProcRef is high, the noise (e.g. the integrated phase error) generated in the radio-frequency clock signal CK_RF is small and the settling time is short since the control bandwidth of the frequency synthesizer circuit 310 can be wide. The clock frequency settling time is defined as the time required from an unlocked state to a locked state, for the frequency synthesizer circuit 310 to lock the frequency of the radio-frequency clock signal CK_RF to a target frequency. Generally, when the frequency of the radio-frequency clock signal CK_RF is locked, the phase error can be less than a predetermined value, such as, 1 ppm or 5 degrees.

On the other hand, when the frequency of the processed reference clock signal CK_ProcRef is low, although the noise may be larger and the clock frequency settling time may be longer than the case when the frequency of the processed reference clock signal CK_ProcRef is high, the power consumption of the frequency synthesizer circuit 310 can be lower.

Therefore, in the embodiments of the invention, the reference clock signal processor 320 may dynamically adjust the frequency of the reference clock signal according to different reference clock frequency requirements of the communications apparatus 100, so as to reduce power consumption of the communications apparatus 100.

According to the embodiments of the invention, the reference clock controller 330 may determine the reference clock frequency requirements of the communications apparatus 100 according to a plurality of factors, and generate the indication signal S_Ind and the control signal S_Ctrl according to the required reference clock frequency.

The factors that can be utilized for determining the reference clock frequency requirements may comprise a signal-to-noise ratio (SNR) requirement, a radio-frequency clock frequency settling time requirement (i.e. the system required clock frequency settling time that is required by the communications apparatus system), a power-saving requirement, a modulation order to be used or being used, a communication type, a data buffer usage, a communications status, a communication channel type, the stabilization of the radio-frequency clock signal CK_RF, etc.

To be more specific, according to an embodiment of the invention, when the SNR required for the communications apparatus 100 to communicate with a network device is higher than a predetermined SNR threshold, the required reference clock frequency is high, and when the required SNR is not higher than the predetermined SNR threshold, the required reference clock frequency is low. Generally, the network device may indicate a modulation scheme for communications. The modulation scheme may be decided according to the RF channel conditions and the quantity of data to be transferred, and may have a corresponding SNR requirement.

According to another embodiment of the invention, when a system required clock frequency settling time of the communications apparatus 100 is shorter than a predetermined settling time threshold, the required reference clock frequency is high, and when the system required clock frequency settling time is not shorter than the predetermined settling time threshold, the required reference clock frequency is low. As discussed above, the higher the reference clock signal frequency is, the shorter clock frequency settling time that the frequency synthesizer circuit 310 can achieve.

According to yet another embodiment of the invention, when the communications apparatus 100 is not required to save power, the required reference clock frequency is high, and when the communications apparatus is required to save power, the required reference clock frequency is low.

According to yet another embodiment of the invention, when a modulation order that is determined to be used or is being used for communications is higher than a predetermined modulation order threshold, the required reference clock frequency is high (since for a high order modulation, the required SNR is high). When a modulation order that is determined to be used or is being used for communications is lower than the predetermined modulation order threshold, the required reference clock frequency is low. As an example, the 16QAM, 64QAM and 256QAM are generally regarded as high order modulations, while the BPSK and QPSK are generally regarded as low order modulations.

According to yet another embodiment of the invention, when a type of communication that requires high SNR or short clock frequency settling time is to be processed, the required reference clock frequency is high, and when a type of communication that does not require high SNR or short clock frequency settling time is to be processed, the required reference clock frequency is low. For example, since the data throughput for packet data communication is higher than that for voice communication, the required reference clock frequency for packet data communication is higher than that for voice communication.

According to yet another embodiment of the invention, when a data buffer usage is high, the data throughput is high and the required reference clock frequency is high. When data buffer usage is low, the required reference clock frequency is low. For example, the data buffer usage for buffering voice data is relatively lower than that for buffering packet data.

According to yet another embodiment of the invention, when the communications apparatus 100 is in a communications status that requires high SNR or short clock frequency settling time, the required reference clock frequency is high. When the communications apparatus 100 is in a communications status that does not require high SNR or short clock frequency settling time, the required reference clock frequency is low. For example, when the communications apparatus 100 is performing pre-synchronization to synchronize time or frequency with the network device or is operating in a standby mode, a sleep mode or a discontinuous reception (DRX) off duration, the communications apparatus 100 may not need high SNR or short clock frequency settling time. When the communications apparatus 100 is performing dedicated data communications (including a random access procedure, channel establishment, data transmission, and so on) or a DRX on duration, the communications apparatus 100 may need a high SNR or a short clock frequency settling time.

According to yet another embodiment of the invention, when the communications apparatus 100 is going to communicate with the network device on the data channel for performing data transmission or reception, the required reference clock frequency is high. When the communications apparatus 100 is going to communicate with the network device on the control channel for performing control signal transmission or reception, the required reference clock frequency is low.

According to yet another embodiment of the invention, when the radio-frequency clock signal CK_RF has not yet been stabilized (for example, the phase error thereof is higher than a predetermined value, such as, 1 ppm or 5 degrees), the required reference clock frequency is high (since fast settling is required). When the radio-frequency clock signal CK_RF has been stabilized, the required reference clock frequency is low for further reducing the power consumption.

When the required reference clock frequency is high, the reference clock signal processor 320 may perform frequency up-conversion on the received original reference clock signal CK_Ref to generate the processed reference clock signal CK_ProcRef with a higher frequency. Therefore, when the required reference clock frequency is high, the frequency of the processed reference clock signal CK_ProcRef may be higher than the frequency of the original reference clock signal CK_Ref, and may be a multiple (either an integer or a fractional multiple) of the frequency of the original reference clock signal CK_Ref. Note that when the required reference clock frequency is high, the reference clock signal processor 320 may also directly output the original reference clock signal CK_Ref without any frequency conversion. Therefore, when the required reference clock frequency is high, the frequency of the processed reference clock signal CK_ProcRef may also be equal to the frequency of the original reference clock signal CK_Ref.

When the required reference clock frequency is low, the reference clock signal processor 320 may perform frequency down-conversion on the received original reference clock signal CK_Ref to generate the processed reference clock signal CK_ProcRef with a lower frequency. Therefore, when the required reference clock frequency is low, the frequency of the processed reference clock signal CK_ProcRef may be lower than the frequency of the original reference clock signal CK_Ref, and the frequency of the original reference clock signal CK_Ref may be a multiple (either an integer or a fractional multiple) of the frequency of the processed reference clock signal CK_ProcRef. Note that when the required reference clock frequency is low, the reference clock signal processor 320 may also directly output the original reference clock signal CK_Ref without any frequency conversion. Therefore, when the required reference clock frequency is low, the frequency of the processed reference clock signal CK_ProcRef may also be equal to the frequency of the original reference clock signal CK_Ref.

Note further that in the embodiments of the invention, the frequency of the processed reference clock signal CK_ProcRef can be dynamically adjusted not only between different radio links, but also can be dynamically adjusted hitless during existence of a radio link that is established between a network device and the communications apparatus for communications.

For establishing a radio link, the network device may give the communications apparatus 100 a band number and the communications apparatus 100 may perform cell search, find out the channel number (e.g. the EARFCN (EUTRA Absolute Radio-Frequency Channel Number)) of the cell in the band and establish the radio link with the cell. The radio link will be kept until a cell change occurs.

Figure 4:
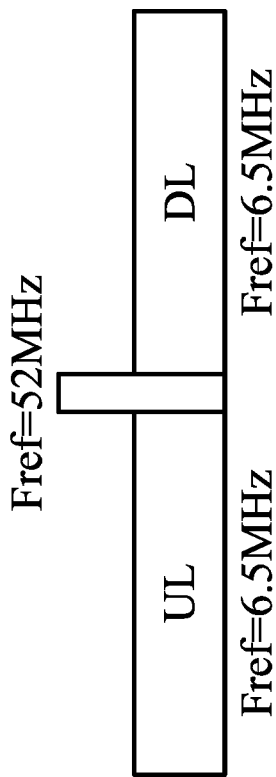
FIG. 4 shows an exemplary scenario of dynamically adjusting the frequency of the reference clock signal according to an embodiment of the invention.

FIG. 4 shows an exemplary scenario of dynamically adjusting the frequency of the reference clock signal according to an embodiment of the invention. The network device may assign an uplink-downlink configuration to be utilized for communications. Based on different uplink-downlink configuration, the downlink-uplink switch may occur at a different sub-frame. However, since the bandwidth required for downlink reception is generally wider than that for uplink transmission, for saving the transceiver or receiver power, the central frequencies for downlink and uplink operations are different. Therefore, to switch between downlink and uplink sub-frames, the central frequencies thereof should be switched as well.

For rapidly switching between different central frequencies to satisfy the standard's requirement and without degrading the communication performance, the clock frequency settling time should be as short as possible. Therefore, in the embodiment, when determining that switching from a downlink sub-frame to an uplink sub-frame or from an uplink sub-frame to a downlink sub-frame is required, the reference clock controller 330 may generate the indication signal S_IND and the control signal S_Ctrl to indicate that the required reference clock frequency is high. As shown the exemplary scenario in FIG. 4, where the frequency of the original reference clock signal CK_Ref Fref is 26 MHz, when switching is required, the reference clock signal processor 320 may generate the processed reference clock signal CK_ProcRef oscillating at a higher frequency, for example, Fref=52 MHz for fast clock frequency settling. In addition, in response to the control signal S_Ctrl, the frequency synthesizer circuit 310 may adjust parameters utilized for generating the radio-frequency clock signal CK_RF according to the control signal S_Ctrl.

On the other hand, when the reference clock controller 330 determines that switching is not required or determines that the radio-frequency clock signal CK_RF has been stabilized, the reference clock controller 330 may generate the indication signal S_IND and the control signal S_Ctrl to indicate that the required reference clock frequency is low. In response to the indication signal S_IND, the reference clock signal processor 320 may generate the processed reference clock signal CK_ProcRef oscillating at a lower frequency, for example, Fref=6.5 MHz. In addition, in response to the control signal S_Ctrl, the frequency synthesizer circuit 310 may adjust parameters utilized for generating the radio-frequency clock signal CK_RF according to the control signal S_Ctrl.

Figure 5:
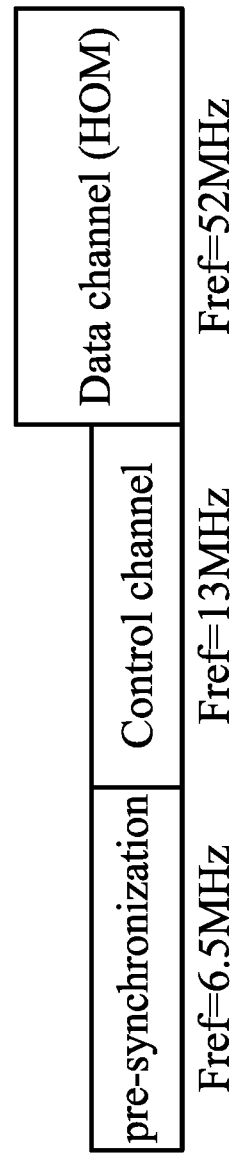
FIG. 5 shows an exemplary scenario of dynamically adjusting the frequency of the reference clock signal according to another embodiment of the invention.

FIG. 5 shows an exemplary scenario of dynamically adjusting the frequency of the reference clock signal according to another embodiment of the invention. In this embodiment, the reference clock controller 330 may determine the reference clock frequency requirement according to the communications status and the communication channel type. When the communications apparatus 100 is going to communicate with the network device on a data channel for performing data transmission or reception, since a high order modulation is adopted, the required reference clock frequency is high. When the communications apparatus 100 is going to perform pre-synchronization of the communications apparatus 100 or communicate with the network device on a control channel for performing control signal transmission or reception, the required reference clock frequency is low.

Therefore, in this embodiment, the reference clock controller 330 may generate the indication signal S_IND and the control signal S_Ctrl to indicate that the required reference clock frequency is low for pre-synchronization and control channel communications. As shown in the exemplary scenario in FIG. 5, where the frequency of the original reference clock signal CK_Ref Fref is 26 MHz, in response to the indication signal S_IND, the reference clock signal processor 320 may generate the processed reference clock signal CK_ProcRef oscillating at a lower frequency, for example, Fref=6.5 or 13 MHz. In addition, the frequency synthesizer circuit 310 may also adjust parameters utilized for generating the radio-frequency clock signal CK_RF according to the control signal S_Ctrl.

On the other hand, the reference clock controller 330 may generate the indication signal S_IND and the control signal S_Ctrl to indicate that the required reference clock frequency is high for data channel communications. In response to the indication signal S_IND, the reference clock signal processor 320 may generate the processed reference clock signal CK_ProcRef oscillating at a higher frequency, for example, Fref=52 MHz. In addition, the frequency synthesizer circuit 310 may also adjust parameters utilized for generating the radio-frequency clock signal CK_RF according to the control signal S_Ctrl.

According to an embodiment of the invention, the reference clock signal processor 320 may selectively output rising/falling edges of the original reference clock signal according to the indication signal S_IND to generate the processed reference clock signal CK_ProcRef.

Figure 6:
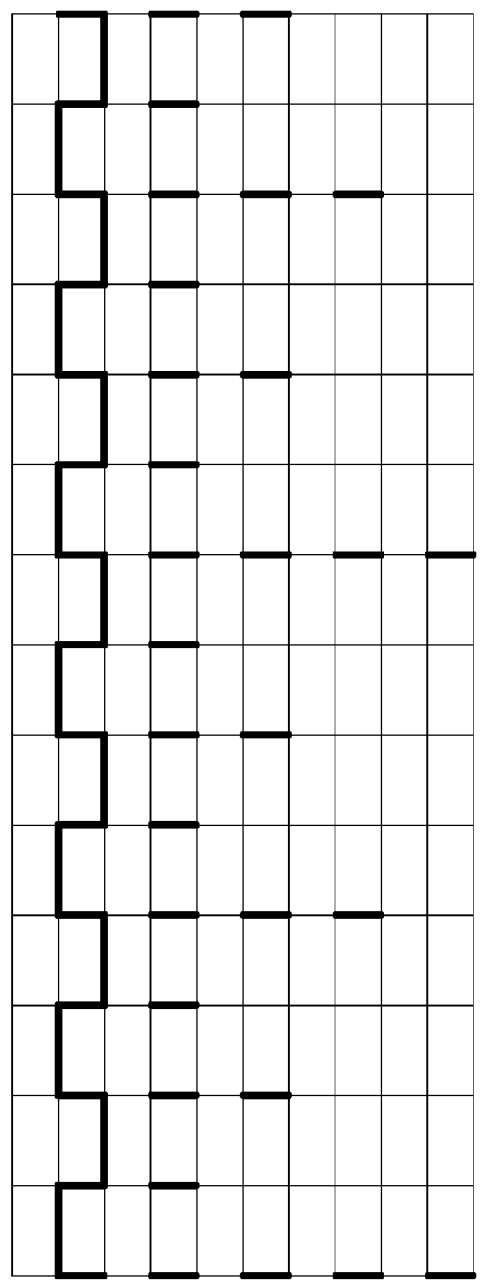
FIG. 6 is a schematic diagram showing the concept of one of a plurality of conversion methods of processing the original reference clock signal according to an embodiment of the invention.

FIG. 6 is a schematic diagram showing the concept one of a plurality of conversion methods of processing the original reference clock signal according to an embodiment of the invention. According to an embodiment of the invention, when the reference clock signal processor 320 performs frequency up-conversion on the received original reference clock signal CK_Ref, the reference clock signal processor 320 may output every rising and falling edge of the original reference clock signal CK_Ref, and may further invert the falling edges to become rising edges, so as to increase the frequency of the reference clock signal.

As shown in FIG. 6, the frequency of the original reference clock signal Fref=26 MHz. When the required reference clock frequency is high, such as Fref=52 Mz, the reference clock signal processor 320 may output every rising and falling edge of the original reference clock signal CK_Ref, so as to doubles the frequency of the reference clock signal.

On the other hand, when the reference clock signal processor 320 performs frequency down-conversion on the received original reference clock signal CK_Ref, the reference clock signal processor 320 may not output every rising/falling edge of the original reference clock signal CK_Ref. The reference clock signal processor 320 may ignore some rising/falling edges of the original reference clock signal CK_Ref, so as to decrease the frequency of the reference clock signal.

As an example, when the frequency of the processed reference clock signal CK_ProcRef is to be 1/N times of the frequency of the original reference clock signal CK_Ref, the reference clock signal processor 320 may output a rising/falling edge for every N rising/falling edge of the original reference clock signal CK_Ref as the processed reference clock signal CK_ProcRef. The remaining rising/falling edges of the original reference clock signal CK_Ref are ignored.

As shown in FIG. 6, when the required reference clock frequency is low, such as Fref=13 Mz, the reference clock signal processor 320 may output a rising/falling edge for every 2 rising/falling edges of the original reference clock signal CK_Ref as the processed reference clock signal CK_ProcRef. When the required reference clock frequency is low, such as Fref=6.5 Mz, the reference clock signal processor 320 may output a rising/falling edge for every 4 rising/falling edges of the original reference clock signal CK_Ref as the processed reference clock signal CK_ProcRef.

Note that since the frequency synthesizer circuit 310 receiving the processed reference clock signal CK_ProcRef is ticked by the processed reference clock signal CK_ProcRef (for example, ticked by the pulses or edges of the processed reference clock signal CK_ProcRef), when the rising/falling edges become dense or loose, the operating frequency of the frequency synthesizer circuit 310 will be increased or decreased accordingly.

According to another embodiment of the invention, the reference clock signal processor 320 may selectively output a pulse in response to rising/falling edges of the original reference clock signal CK_Ref according to the indication signal S_IND, so as to generate the processed reference clock signal CK_ProcRef.

In this embodiment, when the reference clock signal processor 320 performs frequency up-conversion on the received original reference clock signal CK_Ref, the reference clock signal processor 320 may output one or more pulse for every rising and falling edge of the original reference clock signal CK_Ref, so as to increase the frequency of the reference clock signal.

On the other hand, when the reference clock signal processor 320 performs frequency down-conversion on the received original reference clock signal CK_Ref, the reference clock signal processor 320 may not output a pulse for every rising/falling edge of the original reference clock signal CK_Ref. The reference clock signal processor 320 may ignore some rising/falling edges of the original reference clock signal CK_Ref, so as to decrease the frequency of the reference clock signal.

As an example, when the frequency of the processed reference clock signal CK_ProcRef is to be 1/N times of the frequency of the original reference clock signal CK_Ref, the reference clock signal processor 320 may output a pulse for every N rising/falling edges of the original reference clock signal CK_Ref as the processed reference clock signal CK_ProcRef. The remaining rising/falling edges of the original reference clock signal CK_Ref are ignored.

Since the frequency synthesizer circuit 310 receiving the processed reference clock signal CK_ProcRef is ticked by the processed reference clock signal CK_ProcRef (for example, ticked by the pulses or edges of the processed reference clock signal CK_ProcRef), when the space between pulses becomes dense or loose, the operating frequency of the frequency synthesizer circuit 310 will be increased or decreased accordingly.

Figure 7:
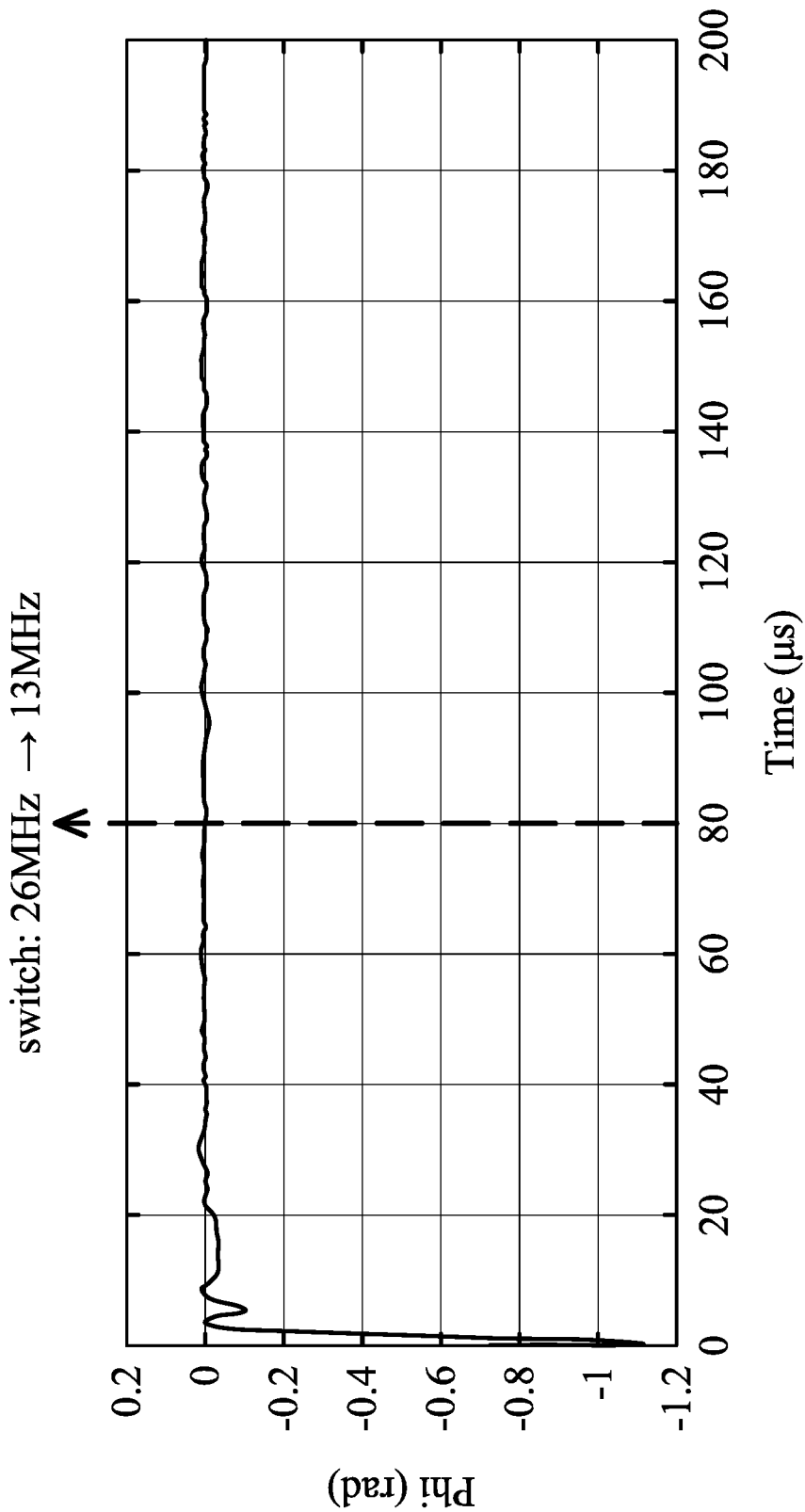
FIG. 7 shows a simulation result of dynamically adjusting the frequency of the reference clock signal according to an embodiment of the invention.

FIG. 7 shows a simulation result of dynamically adjusting the frequency of the reference clock signal according to an embodiment of the invention. In this embodiment, the frequency of the reference clock signal is adjusted from 26 MHz to 13 MHz at 80 us. As shown in FIG. 7, the phase error indicator (PHI) shows that the phase error is not greatly increased when adjusting the reference clock frequency. Therefore, the proposed structure and controlling method can greatly reduce power consumption without introducing too much noise into the resulting clock signals.

In addition, the proposed structure and controlling method are simple. Therefore, the complexity to implement the proposed concept is low as well. In addition, the proposed structure and controlling method can be applied in any communications system that requires low power consumption, high-order modulation and/or fast settling, such as 5G, LTE, WiFi, or others.

The embodiments of the present invention can be implemented in any of numerous ways. For example, the embodiments may be implemented using hardware, software or a combination thereof. It should be appreciated that any component or collection of components that perform the functions described above can be generically considered as one or more processors that control the function discussed above. The one or more processors can be implemented in numerous ways, such as with dedicated hardware, or with general-purpose hardware that is programmed using microcode or software to perform the functions recited above.

While the invention has been described by way of example and in terms of preferred embodiment, it should be understood that the invention is not limited thereto. Those who are skilled in this technology can still make various alterations and modifications without departing from the scope and spirit of this invention. Therefore, the scope of the present invention shall be defined and protected by the following claims and their equivalents.

What is claimed is:

1. A frequency-generating circuit, comprising:
   a frequency synthesizer circuit, receiving a processed reference clock signal and generating a radio-frequency clock signal according to the processed reference clock signal; and
   a reference clock signal processor, receiving an original reference clock signal from an oscillator and processing the original reference clock signal according to an indication signal to generate the processed reference clock signal,
   wherein the indication signal is generated according to a required reference clock frequency of a communications apparatus, and
   wherein when the required reference clock frequency is high, a frequency of the processed reference clock signal is a multiple of a frequency of the original reference clock signal, and when the required reference clock frequency is low, the frequency of the original reference clock signal is a multiple of the frequency of the processed reference clock signal.

2. The frequency-generating circuit as claimed in claim 1, wherein when a signal-to-noise ratio (SNR) required for the communications apparatus to communicate with a network device is higher than a predetermined SNR threshold, the required reference clock frequency is high, and when the required SNR is not higher than the predetermined SNR threshold, the required reference clock frequency is low.

3. The frequency-generating circuit as claimed in claim 1, wherein when a system required clock frequency settling time of the communications apparatus is shorter than a predetermined settling time threshold, the required reference clock frequency is high, and when the system required clock frequency settling time is not shorter than the predetermined settling time threshold, the required reference clock frequency is low.

4. The frequency-generating circuit as claimed in claim 1, wherein when power-saving of the communications apparatus is not required, the required reference clock frequency is high, and when power-saving of the communications apparatus is required, the required reference clock frequency is low.

5. The frequency-generating circuit as claimed in claim 1, wherein the reference clock signal processor selectively outputs rising/falling edges of the original reference clock signal according to the indication signal to generate the processed reference clock signal.

6. The frequency-generating circuit as claimed in claim 1, wherein the reference clock signal processor selectively outputs a pulse in response to rising/falling edges of the original reference clock signal according to the indication signal to generate the processed reference clock signal.

7. The frequency-generating circuit as claimed in claim 1, wherein the frequency synthesizer circuit further controls parameters utilized for generating the radio-frequency clock signal according to the required reference clock frequency.

8. The frequency-generating circuit as claimed in claim 1, wherein the frequency of the processed reference clock signal is dynamically adjusted during existence of a radio link established between a network device and the communications apparatus.

9. A communications apparatus, comprising:
a frequency-generating circuit, generating a radio-frequency clock signal according to an original reference clock signal; and
a reference clock controller, generating an indication signal according to a required reference clock frequency;
wherein the frequency-generating circuit comprises:
a frequency synthesizer circuit, receiving a processed reference clock signal and generating the radio-frequency clock signal according to the processed reference clock signal; and
a reference clock signal processor, receiving the original reference clock signal from an oscillator and processing the original reference clock signal according to the indication signal to generate the processed reference clock signal,
wherein when the required reference clock frequency is high, a frequency of the processed reference clock signal is a multiple of a frequency of the original reference clock signal, and when the required reference clock frequency is low, the frequency of the original reference clock signal is a multiple of the frequency of the processed reference clock signal.

10. The communications apparatus as claimed in claim 9, wherein when the reference clock controller determines that an SNR required for communicating with a network device is higher than a predetermined SNR threshold, the required reference clock frequency is high, and when the SNR required for communicating with the network device is not higher than the predetermined SNR threshold, the required reference clock frequency is low.

11. The communications apparatus as claimed in claim 9, wherein when the reference clock controller determines that a system required clock frequency settling time is shorter than a predetermined settling time threshold, the required reference clock frequency is high, and when the system required clock frequency settling time is not shorter than the predetermined settling time threshold, the required reference clock frequency is low.

12. The communications apparatus as claimed in claim 9, wherein when the reference clock controller determines that power-saving is not required, the required reference clock frequency is high, and when power-saving is required, the required reference clock frequency is low.

13. The communications apparatus as claimed in claim 9, wherein the reference clock signal processor selectively outputs rising/falling edges of the original reference clock signal according to the indication signal to generate the processed reference clock signal.

14. The communications apparatus as claimed in claim 9, wherein the reference clock signal processor selectively outputs a pulse in response to rising/falling edges of the original reference clock signal according to the indication signal to generate the processed reference clock signal.

15. The communications apparatus as claimed in claim 9, wherein the frequency of the processed reference clock signal is dynamically adjusted during existence of a radio link established for communicating with a network device.

16. The communications apparatus as claimed in claim 9, wherein the reference clock controller further generates a control signal according to the required reference clock frequency, and the frequency synthesizer circuit controls parameters utilized for generating the radio-frequency clock signal according to the control signal.

* * * * *